United States Patent
Chang et al.

[11] Patent Number: 5,969,383
[45] Date of Patent: Oct. 19, 1999

[54] SPLIT-GATE MEMORY DEVICE AND METHOD FOR ACCESSING THE SAME

[75] Inventors: Kuo-Tung Chang; Ko-Min Chang; Wei-Ming Chen; Keith Forbes; Douglas R. Roberts, all of Austin, Tex.

[73] Assignee: Motorola, Inc., Schaumburg, Ill.

[21] Appl. No.: 08/876,576

[22] Filed: Jun. 16, 1997

[51] Int. Cl.[6] ................................................ H01L 29/788
[52] U.S. Cl. ................ 257/316; 257/319; 257/321; 365/185.18
[58] Field of Search .................................. 257/316, 319, 257/321; 365/185.18

[56] References Cited

U.S. PATENT DOCUMENTS

| | | | |
|---|---|---|---|
| 5,408,115 | 4/1995 | Chang | 257/324 |
| 5,614,747 | 3/1997 | Ahn et al. | 257/316 |
| 5,691,937 | 11/1997 | Ohta | 365/185.01 |
| 5,703,388 | 12/1997 | Wang et al. | 257/315 |
| 5,729,035 | 3/1998 | Anma et al. | 257/324 |
| 5,780,891 | 7/1998 | Kauffman et al. | 257/316 |
| 5,796,139 | 8/1998 | Fukase | 257/315 |

OTHER PUBLICATIONS

Masanori Kikuchi et al., "Ti Silicidation Technology For High Speed EPROM Devices", IEEE Electron Dev.Soc., 1983 VLSI Symp., Sept. 13–15, 1983, pp. 112–113.

*Primary Examiner*—Sara Crane
*Attorney, Agent, or Firm*—Kent Cooper; George R. Meyer; M. Kathryn Braquet Tsirigotis

[57] ABSTRACT

An EEPROM device includes a split-gate FET (10) having a source (36), a drain (22), a select gate (16) adjacent the drain (22), and a control gate (32) adjacent the source (36). When programming the split-gate FET (10), electrons are accelerated in a portion of a channel region (38) between the select gate (16) and the control gate (32), and then injected into a nitride layer (24) of an ONO stack (25) underlying the control gate (32). The split-gate FET (10) is erased by injecting holes from the channel region (38) into the charge nitride layer (24). When reading data from the split-gate FET (10), a reading voltage is applied to the drain (22) adjacent the select gate (16). Data is then read from the split-gate FET (10) by sensing a current flowing in a bit line coupled to the drain (22).

12 Claims, 2 Drawing Sheets

SPLIT-GATE MEMORY DEVICE AND METHOD FOR ACCESSING THE SAME

COPENDING APPLICATION

Filed concurrently with the present application is an application entitled "Split Gate Memory Device And Method Of Making And Accessing The Same," and having Ser. No. 08/876,326, now U.S. Pat. No. 5,824,584.

BACKGROUND OF THE INVENTION

The present invention relates, in general, to a memory device and, more particularly, to a nonvolatile memory device.

An Electrically Erasable Programmable Read Only Memory (EEPROM) permits stored data to be retained even if power to the memory is removed. An EEPROM cell stores data either by storing electrical charge in an electrically isolated floating gate of a field effect transistor (FET) or by storing electrical charge in a dielectric layer underlying a control gate of a FET. The stored electrical charge controls the threshold of the FET, thereby controlling the memory state of the EEPROM cell.

Conventionally, an EEPROM cell is programmed using drain side hot carrier injection to inject charge carriers either onto a floating gate or into charge trapping sites in a dielectric layer underlying a control gate. High drain and gate voltages are used to speed up the programming process. Thus, the FET in the EEPROM cell conducts a high current during programming, which is undesirable in low voltage and low power applications. Further, the EEPROM cell operates very close to breakdown during programming.

Breakdown conditions during programming can be avoided by using source side carrier injection. To program an EEPROM cell using source side hot carrier injection, a select gate is formed overlying a portion of the channel region adjacent the source region. The select gate is electrically isolated from a control gate formed adjacent the drain region. During programming, an electric field is established in the channel region so that charge carriers originating in the source region are accelerated across the channel region before being injected into a floating gate or a dielectric layer located below the control gate. The select gate controls the channel current. Thus, programming with source side hot carrier injection is more power efficient than the conventional drain side hot carrier injection and suitable for low voltage and low power applications.

Accordingly, it would be advantageous to have a nonvolatile memory device and a method for accessing the nonvolatile memory device which is power efficient and suitable for low power applications. It is also desirable for the nonvolatile memory device to be simple and inexpensive to fabricate, and silicon area efficient. In addition, it is also desirable for the accessing method to be reliable and time efficient.

DETAILED DESCRIPTION OF THE DRAWINGS

Generally, the present invention provides a nonvolatile memory (NVM) device and a method for accessing the NVM device. In accordance with the present invention, the NVM device includes a split-gate field effect transistor (FET) having a control gate overlying a first portion of the channel region near the source and a select gate overlying a second portion of the channel region near the drain. When programming the NVM device, charge carriers of a first polarity such as, for example, electrons are accelerated in the second portion of the channel region under the select gate and then injected into a dielectric layer underlying the control gate. In a preferred embodiment of the present invention, the dielectric layer underlying the control gate is comprised of a bottom dielectric layer, e.g., a bottom silicon dioxide layer, over the first portion of the channel region, a top dielectric layer, e.g., a top silicon dioxide layer, under the control gate, and a silicon nitride layer therebetween. The silicon nitride layer contains charge trapping sites formed therein. The NVM device is erased by injecting charge carriers of a second polarity such as, for example, holes from the channel region into the silicon nitride layer. When reading data from the NVM device, a reading voltage is applied to the drain adjacent the select gate. Data is then read from the NVM device by sensing a current flowing in a bit line coupled to the drain of the FET.

Figure 1:
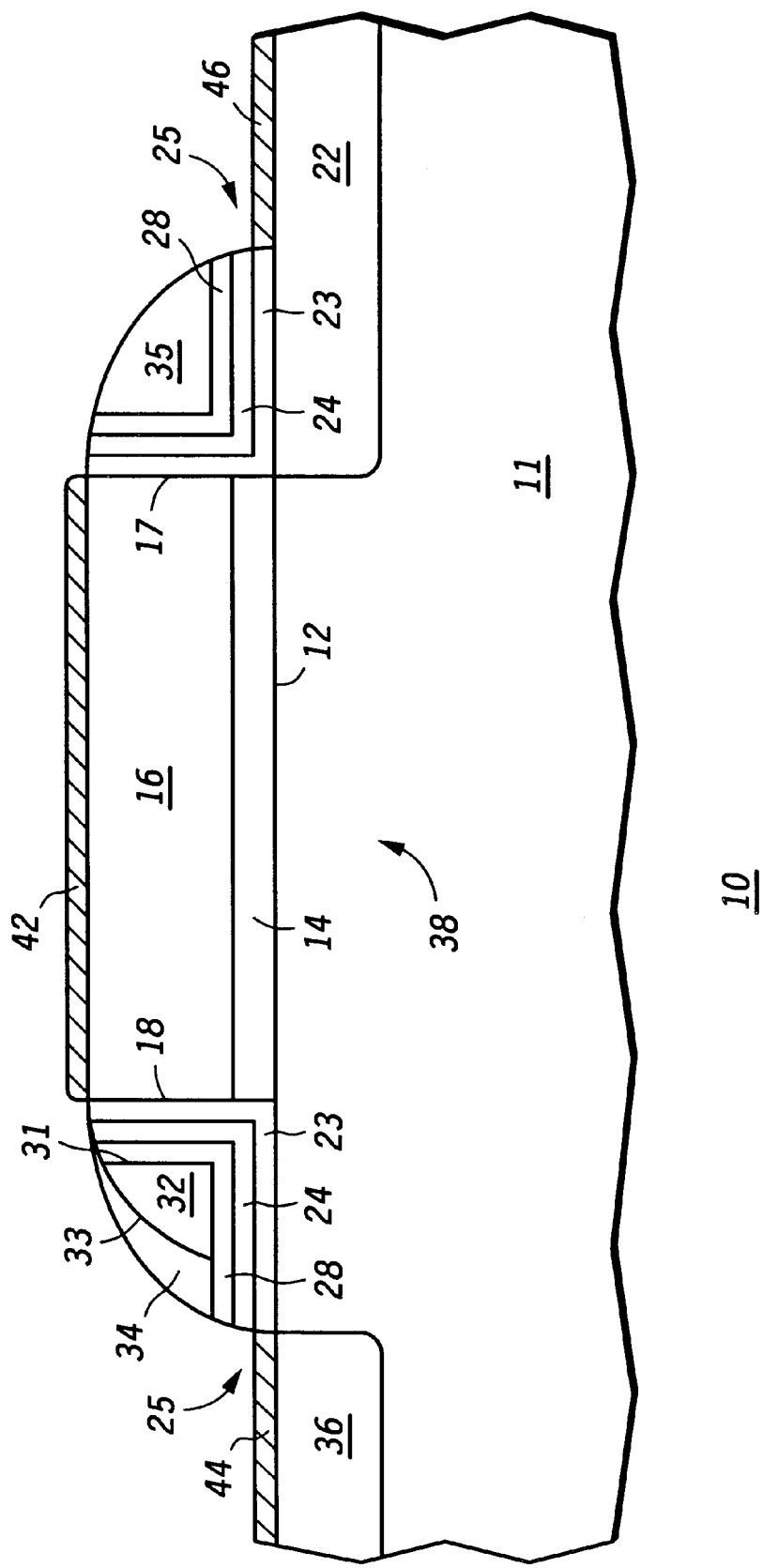
FIG. 1 is a cross-sectional view of a nonvolatile memory device in accordance with the present invention.

FIG. 1 is a cross-sectional view of a split-gate memory device, such as an NVM cell 10, in accordance with the present invention. NVM cell 10 is formed on a body of semiconductor material such as a semiconductor substrate 11 having a major surface 12. By way of example, semiconductor substrate 11 is a silicon substrate of p conductivity type. As described hereinafter, NVM cell 10 is both electrically programmable and erasable. Therefore, NVM cell 10 is also referred to as an Electrically Erasable Programmable Read Only Memory (EEPROM) cell.

A select gate structure 15 includes a dielectric layer 14 overlying substrate 11 and a select gate 16 over dielectric layer 14. Select gate 16 has sidewalls 17 and 18 opposite to each other. By way of example, dielectric layer 14 is a thermally grown silicon dioxide layer having a thickness between approximately 3 nanometers (nm) and approximately 30 nm, and select gate 16 is formed by depositing and patterning a conductive layer over dielectric layer 14. Preferably, the conductive layer is a polycrystalline silicon layer having a thickness between, for example, approximately 150 nm and approximately 300 nm and is deposited over dielectric layer 14 using a chemical vapor deposition process. Further, select gate 16 is preferably doped with ions of an n conductivity type e.g., phosphorus or arsenic ions, either during the chemical vapor deposition process or during a subsequent doping step.

A drain region 22 is aligned with sidewall 17 of select gate 16. By way of example, a self-aligned ion implantation process which implants ions of n conductivity type such as, for example, phosphorus or arsenic ions into substrate 11 is used to form drain region 22. Preferably, the ion implantation process is performed through a pad dielectric layer overlying major surface 12 of substrate 11. The pad dielectric layer can be dielectric layer 14, a sacrificial oxide layer (not shown), or the like.

A dielectric layer such as, for example, a silicon dioxide layer 23 overlies portions of major surface 12 adjacent sidewalls 17 and 18 of select gate 16. Preferably, silicon dioxide layer 23 has a thickness between, for example, approximately 5 nm and approximately 15 nm and is formed using a thermal oxidation process or a deposition process. The thermal oxidation process also oxidizes select gate 16 along sidewalls 17 and 18, and therefore, silicon dioxide layer 23 is also formed along sidewalls 17 and 18. In one embodiment, portions of dielectric layer 14 unprotected by select gate 16 are etched away before forming silicon dioxide layer 23 on major surface 12. In another embodiment, silicon dioxide layer 23 is formed on the portions of dielectric layer 14 unprotected by select gate 16. A silicon nitride layer 24 having a thickness between, for example, approximately 5 nm and approximately 15 nm overlies silicon dioxide layer 23 and is preferably formed using a chemical vapor deposition process. Another dielectric layer such as, for example, a silicon dioxide layer 28 having a thickness between approximately 5 nm and approximately 15 nm overlies silicon nitride layer 24. Silicon dioxide layer 28 can be formed using a deposition process or a thermal oxidation process.

Silicon dioxide layer 23, silicon nitride layer 24, and silicon dioxide layer 28 form an oxide-nitride-oxide (ONO) stack 25, which is also referred to as a dielectric stack. In ONO stack 25, silicon dioxide layer 23 is referred to as a bottom dielectric layer and silicon dioxide layer 28 is referred to as a top dielectric layer. When programming NVM cell 10, charge carriers, e.g., electrons, are injected into ONO stack 25 and trapped in charge trapping sites formed in silicon nitride layer 24. In order for NVM cell 10 to have a good data retention rate, bottom dielectric layer 23 and top dielectric layer 28 are preferably thick. Further, the defects in dielectric layers 23 and 28 are preferably minimized. It should be understood that the chemical composition of silicon nitride layer 24 is not limited to being $Si_3N_4$. For example, silicon nitride layer 24 can be a silicon rich nitride layer that has a chemical composition represented by formula $Si_xN_y$, wherein a ratio of x to y is higher than 3 to 4.

A control gate 32 overlies ONO stack 25. Control gate 32 has a sidewall 31 adjacent select gate 16 and a sidewall 33 opposite to sidewall 31. By way of example, control gate 32 is formed by depositing and patterning a conductive layer over ONO stack 25. Preferably, the conductive layer is a polycrystalline silicon layer having a thickness between, for example, approximately 200 nm and approximately 300 nm and is deposited over ONO stack 25 using a chemical vapor deposition process. In other words, control gate 32 is preferably formed as a polycrystalline silicon sidewall spacer adjacent select gate 16. Further, control gate 32 is preferably doped with ions of n conductivity type, e.g., phosphorus or arsenic ions, either during the chemical vapor deposition process or during a subsequent doping step. It should be noted that the process of forming control gate 32 also forms a polycrystalline silicon sidewall spacer (not shown) along sidewall 17 of select gate 16. However, the polycrystalline silicon sidewall spacer along sidewall 17 of select gate 16 does not participate in the operation of NVM cell 10. In one embodiment, it is removed in a subsequent etching step, resulting in NVM cell 10 as shown in FIG. 1. In another embodiment (not shown), it is coupled to a reference voltage level, e.g., a ground voltage level, during the operation of accessing NVM cell 10.

Dielectric spacers such as, for example, nitride spacers 34 and 35 are formed along sidewall 33 of control gate 32 and along sidewall 17 of select gate 16, respectively. Preferably, nitride spacer 34 covers control gate 32. A source region 36 is aligned with nitride spacer 34. By way of example, a self-aligned ion implantation process which implants ions of n conductivity type such as, for example, phosphorus or arsenic ions into substrate 11 is used to form source region 36. Source region 36 and drain region 22 define a channel region 38 therebetween. In other words, channel region 38 separates source region 36 from drain region 22. A first portion of channel region 38 is under ONO stack 25 and control gate 32, and a second portion of channel region 38 is under select gate structure 15. It should be understood that nitride spacers 34 and 35 are optional in NVM cell 10. In an alternative embodiment in which NVM cell 10 does not include nitride spacers 34 and 35, source region 36 is aligned with sidewall 33 of control gate 32.

It should be noted that the processes of forming ONO stack 25 over major surface 12 also form an ONO stack on top of select gate 16 (not shown). The ONO stack on top of select gate 16 and portions of ONO stack 25 (not shown) on major surface 12 and unprotected by nitride spacers 34 and 35 are removed in an etching process.

A silicide structure 42 overlies select gate 16 and functions as a select gate electrode of NVM cell 10. Likewise, a silicide structure 44 overlies source region 36 and functions as a source electrode of NVM cell 10. In addition, a silicide structure 46 overlies drain region 22 and functions as a drain electrode of NVM cell 10. Silicide structures 42, 44, and 46 are aligned with nitride spacers 34 and 35. Thus, they are also referred to as self-aligned silicide (salicide) structures. Silicide structures 42, 44, and 46 reduce the parasitic resistance in NVM cell 10 and, therefore, improve the performance of NVM cell 10. However, it should be noted that silicide structures 42, 44, and 46 are optional features in NVM cell 10.

After forming silicide structures 42, 44, and 46, an insulating layer (not shown) is formed over substrate 11 and planarized. Metallization regions (not shown) are formed in the insulating layer and electrically coupled to control gate 32, select gate electrode 42, source electrode 44, and drain electrode 46.

Although FIG. 1 shows that control gate 32 is formed as a sidewall spacer adjacent select gate 16, this is not intended as a limitation of the present invention. In an alternative embodiment of the present invention, a polycrystalline silicon select gate is formed as a sidewall spacer along a polycrystalline silicon control gate. In this embodiment, a first polycrystalline silicon layer is patterned over ONO stack 25 to define the control gate. The portions of ONO stack 25 that are not overlain by the control gate are etched away. Dielectric layer 14 is disposed on major surface 12. An ion implantation is performed to form source region 36 aligned with the control gate. A second polycrystalline silicon layer is deposited on dielectric layer 14 and patterned to form the select gate as a sidewall spacer of the control gate. Another ion implantation is performed to form drain region 22 aligned with the select gate.

As described hereinbefore, NVM cell 10 is an n-channel split-gate FET fabricated in p conductivity type substrate 11. However, this is not a limitation of the present invention. In an alternative embodiment, NVM cell 10 is a p-channel split-gate FET fabricated in an n conductivity type semiconductor substrate. In another alternative embodiment, NVM cell 10 is an n-channel split-gate FET fabricated in a well of p conductivity type formed in an n conductivity type semiconductor substrate. In yet another alternative embodiment, NVM cell 10 is a p-channel split-gate FET fabricated in a well of n conductivity type formed in a p conductivity type semiconductor substrate.

Accessing NVM cell 10 of FIG. 1 includes three parts: programming NVM cell 10, erasing NVM cell 10, and reading data from NVM cell 10. These are achieved through biasing select gate 16, control gate 32, source region 36, and drain region 22 of NVM cell 10 to selected voltages.

To electrically program NVM cell 10, a programming drain voltage such as, for example, a ground voltage is applied to drain region 22. A programming select gate voltage that is higher than the programming drain voltage by at least a threshold voltage of the portion of channel region 38 under select gate structure 15 is applied to select gate 16. A programming source voltage that is higher than the programming drain voltage is applied to source region 36. Further, a programming control gate voltage that is higher than the programming source voltage is applied to control gate 32. By way of example, the programming select gate voltage is between approximately one volt and approximately two volts, the programming source voltage is between approximately three volts and approximately five volts, and the programming control gate voltage is between approximately eight volts and approximately ten volts.

Because source region 36 is at a higher voltage level than drain region 22, n-channel split gate FET 10 operates in a reverse active mode. In other words, source region 36 functions as a drain of FET 10 and drain region 22 functions as a source of FET 10 during the programming process. Further, select gate 16 is at a voltage level higher than the voltage level of drain region 22 by at least a threshold voltage of the portion of channel region 38 under select gate structure 15. Thus the portion of channel region 38 under select gate structure 15 is switched on and conductive. Negative charge carriers, e.g., electrons, originate from drain region 22 and are accelerated through the portion of channel region 38 between select gate structure 15 and control gate 32. When they reach the portion of channel region 38 adjacent source region 36 and under control gate 32, the charge carriers are attracted by the high voltage at control gate 32. In a hot carrier injection process, the charge carriers are injected across oxide layer 23 and trapped in a portion of silicon nitride layer 24 adjacent sidewall 31 of control gate 32. As the negative charge carriers, e.g., electrons, move from channel region 38 into silicon nitride layer 24, a threshold voltage of the portion of channel region 38 under control gate 32 increases. Thus, the current flowing through channel region 38 decreases and so does the rate of hot carrier injection. After the programming voltages are removed from NVM cell 10, the injected carriers remain trapped in silicon nitride layer 24. A first logic value, e.g., a logic one, is stored in NVM cell 10, i.e., NVM cell 10 is programmed.

During the programming process, current flowing in channel region 38 is limited by the programming select gate voltage level applied to select gate 16. Preferably, the programming select gate voltage is slightly above the threshold voltage of the portion of channel region 38 under select gate 16, thereby minimizing the current flowing in channel region 38. Thus, the process for programming NVM cell 10 is power efficient and suitable for low voltage and low power applications.

To electrically erase NVM cell 10, an erasing source voltage is applied to source region 36, and an erasing control gate voltage that is lower than the erasing source voltage is applied to control gate 32. By way of example, the erasing source voltage is between approximately five volts and approximately seven volts, and the erasing control gate voltage is between approximately −11 volts and approximately −9 volts. Select gate 16 and drain region 22 do not participate in the erasing process, and they can be either coupled to a reference voltage level, e.g., ground voltage level, or floating. In an alternative embodiment of erasing NVM cell 10, an erasing select gate voltage is applied to select gate 16 and an erasing drain voltage is applied to drain region 22, wherein the erasing select gate voltage is lower than the erasing drain voltage. By way of example, the erasing select gate voltage is between approximately −3 volts and approximately −0.5 volt, and the erasing drain voltage is ground voltage. Because select gate 16 is at a lower voltage level than drain region 22, the portion of channel region 38 under select gate 16 is ensured to be nonconductive. In another alternative embodiment of erasing NVM cell 10, a positive voltage, e.g., a voltage between approximately two volts and approximately five volts, is applied to drain region 20 to prevent an inadvertent charge carrier injection form drain region 22 to channel region 38.

Because of a high voltage difference between source region 36 and control gate 32, e.g., ranging from approximately fourteen volts to approximately eighteen volts, a strong electric field is established in the portion of channel region 38 under control gate 32. Through a band to band tunneling process, the strong electric field generates electron-hole pairs in a portion of channel region 38 adjacent source region 36. The holes, which are positive charge carriers, are attracted by the negative voltage at control gate 32. In a hot carrier injection process, the holes are injected across oxide layer 23 into silicon nitride layer 24 of ONO stack 25, where they combine with the electrons in silicon nitride layer 24. Preferably, the erasing process continues until silicon nitride layer 24 become substantially electrically neutral or positively charged. After the erasing voltages are removed from NVM cell 10, silicon nitride layer 24 remain substantially neutral or positively charged. In either case, a second logic value, e.g., a logic zero, is stored in NVM cell 10, i.e., NVM cell 10 is erased.

During the erasing process, the charges stored in the charge trapping sites in silicon nitride layer 24 are neutralized by charges of opposite polarity injected from channel region 38. Compared with the erasing process in which the charges in charge trapping sites move to a control gate in a Fowler-Nordheim tunneling process through a dielectric layer between the charge trapping sites and the control gate, the erasing process of the present invention allows a thick top dielectric layer 28 in ONO stack 25, thereby improving the data retention of NVM cell 10.

To read data from NVM cell 10, a reading source voltage such as, for example, ground voltage is applied to source region 36. A reading control gate voltage that is substantially equal to or higher than the reading source voltage is applied to control gate 32. A reading select gate voltage that is higher than the reading source voltage by at least a threshold voltage of the portion of channel region 38 under select gate structure 15 is applied to select gate 16. Thus, the portion of channel region 38 under select gate structure 15 is switched on and conductive. A reading drain voltage that is higher than the reading source voltage is applied to drain region 22. By way of example, the reading control gate voltage is between approximately one volt and approximately two volts, the reading drain voltage is between approximately one volts and approximately two volt, and select gate 16 is coupled to a supply voltage, $V_{DD}$. By way of example, the supply voltage $V_{DD}$ ranges between approximately three volts and approximately five volts. In low power applications, the supply voltage $V_{DD}$ usually ranges between, for example, approximately 0.9 volt and approximately 1.8 volts.

If NVM cell 10 has been programmed, the silicon nitride layer 24 under control gate 32 is negatively charged. The portion of channel region 38 under control gate 32 has a threshold voltage that is higher than its intrinsic threshold voltage when the silicon nitride layer 24 under control gate 32 is substantially neutral. If NVM cell 10 has been erased, the silicon nitride layer 24 under control gate 32 is substantially neutral or positively charged. The portion of channel region 38 under control gate 32 has a threshold voltage that is substantially equal to or lower than its intrinsic threshold voltage. The reading control gate voltage is preferably lower than the threshold voltage of the portion of channel region 38 under control gate 32 if NVM cell 10 has been programmed. In addition, the reading control gate voltage is preferably higher than the threshold voltage of the portion of channel region 38 under control gate 32 if NVM cell 10 has been erased. Therefore, when reading data from a programmed NVM cell 10, channel region 38 is nonconductive and the current flowing therethrough is small, e.g., equal to or less than approximately 2 micro-amperes ($\mu A$). A sense amplifier (not shown) coupled to drain region 22 via a bit line (not shown in FIG. 1) senses the small current and reads the first logic value, e.g., logic one, from NVM cell 10. On the other hand, when reading data from an erased NVM cell 10, channel region 38 is conductive and the current flowing therethrough is large, e.g., equal to or greater than approximately 10 $\mu A$. The sense amplifier (not shown) coupled to drain region 22 senses the large current and reads the second logic value, logic zero, from NVM cell 10.

During the reading process, source region 36 is at a lower voltage level than drain region 22. The voltage drop across the portion of channel region 38 under control gate 32 is small. Thus, the probability of charge carriers being inadvertently injected from channel region 38 into silicon nitride layer 24 is small. In other words, the disturbance to the data stored in NVM cell 10 during the reading process is small. In accordance with the present invention, the sense amplifier (not shown) is coupled to drain region 22 via a bit line (not shown in FIG. 1) and drain region 22 is separated from silicon nitride layer 24 by select gate structure 15. Therefore, the capacitance of a parasitic bit line capacitor is substantially independent of the charges in silicon nitride layer 24. In other words, the data dependence of the parasitic bit line capacitance is small in NVM cell 10. An NVM cell, such as NVM cell 10, having a small data dependence of the bit line capacitance is suitable for high performance applications.

Figure 2:
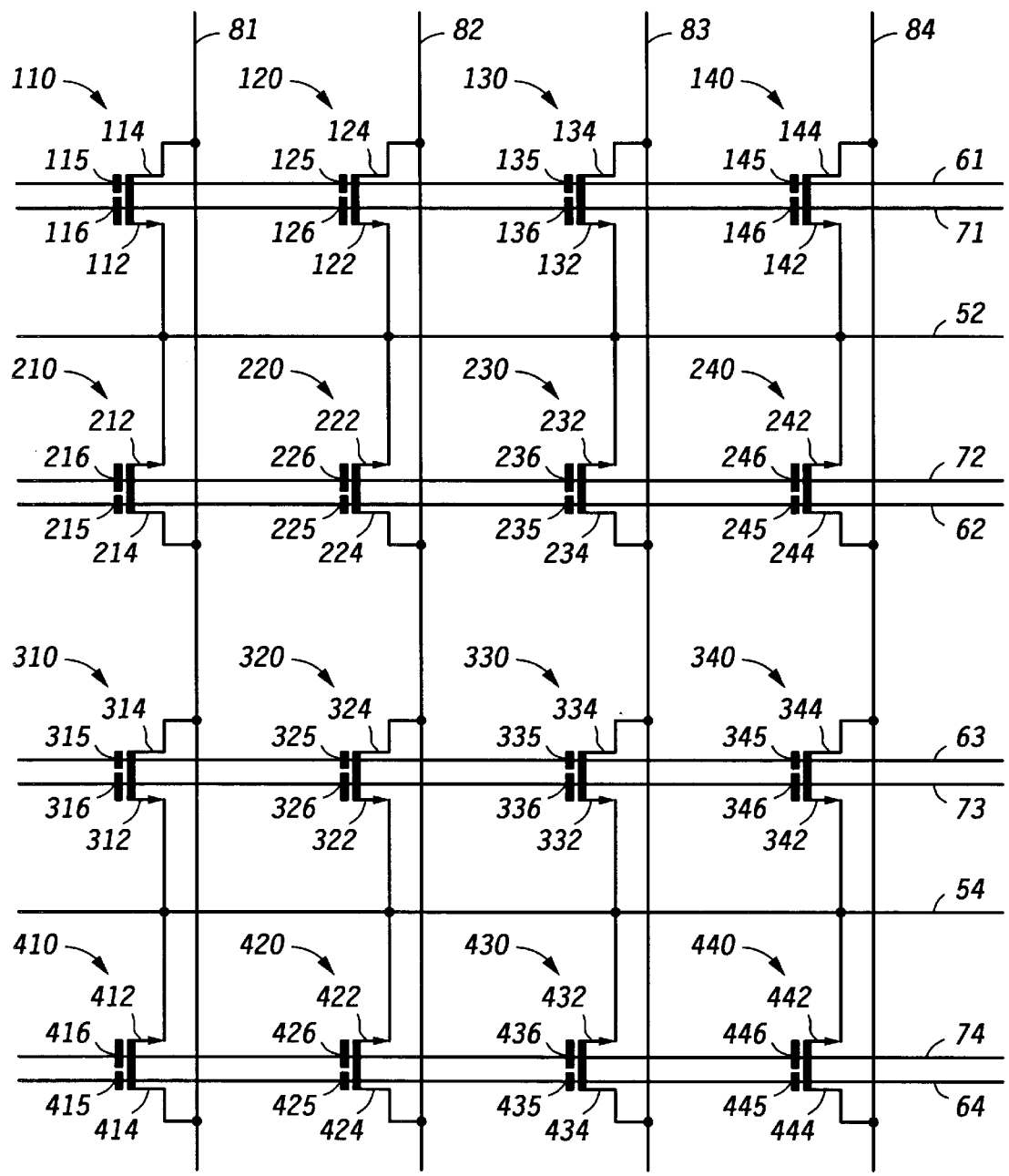
FIG. 2 is a schematic diagram of a nonvolatile memory device in accordance with the present invention.

FIG. 2 is a schematic diagram of a split-gate NVM device 50 in accordance with the present invention. NVM device 50 is fabricated in a semiconductor substrate (not shown in FIG. 2) and includes an array of split-gate FETs arranged in rows and columns. The split-gate FETs function as memory cells in NVM device 50. Each split-gate FET in the array includes a source region, a drain region, and a channel region separating the source region from the channel region. A select gate structure overlies a portion of the channel region adjacent the drain region. A dielectric stack overlies another portion of the channel region adjacent the source region. A control gate is disposed on the dielectric stack and electrically insulated from the select gate. A split-gate FET in the array stores one bit of data. Therefore, a split-gate FET in the array is also referred to as a bit cell in NVM device 50. Preferably, the split-gate FETs in NVM device 50 are structurally identical to split-gate NVM cell 10 shown in FIG. 1. FIG. 2 shows sixteen bit cells arranged in four rows and four columns. However, this is not a limitation of the present invention. In accordance with the present invention, NVM device 50 may include an array of bit cells arranged in any number of rows and any number of columns.

NVM device 50 is accessed through source lines 52 and 54, select lines 61, 62, 63, and 64, control lines 71, 72, 73, and 74, and bit lines 81, 82, 83, and 84. The bit cells in NVM device 50 are addressed by their positions, e.g., their row numbers and column numbers, in the array. In the first row, bit cells 110, 120, 130, and 140 are positioned in the first, second, third, and fourth columns, respectively. In the second row, bit cells 210, 220, 230, and 240 are positioned in the first, second, third, and fourth columns, respectively. In the third row, bit cells 310, 320, 330, and 340 are positioned in the first, second, third, and fourth columns, respectively. In the fourth row, bit cells 410, 420, 430, and 440 are positioned in the first, second, third, and fourth columns, respectively.

Source line 52 is connected to sources 112, 122, 132, and 142 of bit cells 110, 120, 130, and 140, respectively, of the first row. Source line 52 is also connected to sources 212, 222, 232, and 242 of bit cells 210, 220, 230, and 240, respectively, of the second row. Source line 54 is connected to sources 312, 322, 332, and 342 of bit cells 310, 320, 330, and 340, respectively, of the third row. Source line 54 is also connected to sources 412, 422, 432, and 442 of bit cells 410, 420, 430, and 440, respectively, of the fourth row. In accordance with the present invention, the bit cells having their sources coupled to the same source line are erased together and, therefore, form an erasing block. Thus, NVM device 50 includes two erasing blocks, one comprised of the bit cells in the first and second rows, and the other comprised of the bit cells in the third and fourth rows.

Select line 61 is connected to select gates 115, 125, 135, and 145 of bit cells 110, 120, 130, and 140, respectively, of the first row. Select line 62 is connected to select gates 215, 225, 235, and 245 of bit cells 210, 220, 230, and 240, respectively, of the second row. Select line 63 is connected to select gates 315, 325, 335, and 345 of bit cells 310, 320, 330, and 340, respectively, of the third row. Select line 64 is connected to select gates 415, 425, 435, and 445 of bit cells 410, 420, 430, and 440, respectively, of the fourth row.

Control line 71 is connected to control gates 116, 126, 136, and 146 of bit cells 110, 120, 130, and 140, respectively, of the first row. Control line 72 is connected to control gates 216, 226, 236, and 246 of bit cells 210, 220, 230, and 240, respectively, of the second row. Control line 73 is connected to control gates 316, 326, 336, and 346 of bit cells 310, 320, 330, and 340, respectively, of the third row. Control line 74 is connected to control gates 416, 426, 436, and 446 of bit cells 410, 420, 430, and 440, respectively, of the fourth row.

Bit line 81 is connected to drains 114, 214, 314, and 414 of bit cells 110, 210, 310, and 410, respectively, of the first column. Bit line 82 is connected to drains 124, 224, 324, and 424 of bit cells 120, 220, 320, and 420, respectively, of the second column. Bit line 83 is connected to drains 134, 234, 334, and 434 of bit cells 130, 230, 330, and 430, respectively, of the third column. Bit line 84 is connected to drains 144, 244, 344, and 444 of bit cells 140, 240, 340, and 440, respectively, of the fourth column.

It should be understood that the bit cells in NVM device 50 are not limited to being coupled as described hereinbefore. For example, source line 52 and source line 54 can be coupled to each other. In other words, the sources of the bit cells in the first second, third, and fourth rows in the array can all be coupled to the same source line. Thus, NVM device 50 has an erasing block comprised of the bit cell in the first, second, third, and fourth rows. Further, control lines 71 and 72 can be coupled to each other, and control lines 73 and 74 can be coupled to each other. Thus, the bit cells in the first and second rows share a control line, and the bit cells in the third and fourth rows share a control line.

Each bit cell in NVM device 50 can be individually electrically programmed. Data stored in each bit cell can also be individually read by sensing a current flowing in bit line 81, 82, 83, or 84. Further, the bit cells in an erasing block share a common source line and can be electrically erased together. Therefore, NVM device 50 is also referred to as a flash EEPROM device.

To electrically program bit cells, e.g., bit cells 110 and 120, in NVM device 50, a source programming voltage between, for example, approximately three volts and approximately five volts is applied to source line 52. A first select programming voltage between, for example, approximately one volt and approximately two volts is applied to select line 61. Because the bit cells in the second, third, and fourth rows do not participate in the process of programming bit cells 110 and 120, they are switched off by applying a second select programming voltage, e.g., ground voltage, to select lines 62, 63, and 64. A control programming voltage between, for example, approximately eight volts and approximately ten volts is applied to control line 71. Preferably, the control programming voltage is set to be higher than the source programming voltage and higher than the first select programming voltage. A first bit programming voltage, e.g., the supply voltage $V_{DD}$, is applied to bit lines 83 and 84. Preferably, a difference between the first bit programming voltage applied to bit lines 83 and 84 and the first select programming voltage applied to select line 61 is lower than the threshold voltages of the portions of the channel regions under select gates 135 and 145 of bit cells 130 and 140, respectively. A second bit programming voltage, e.g., ground voltage, is applied to bit lines 81 and 82. Therefore, bit cells 110 and 120 are switched on and operate in a reverse active mode. In other words, sources 112 and 122 function as the drains of bit cells 110 and 120, respectively, and drains 114 and 124 function as the sources of bit cells 110 and 120, respectively, during the programming process. Negative charge carriers, e.g., electrons, originate from drains 114 and 124 of bit cells 110 and 120, respectively, and are accelerated through the channel region between select gate 115 and control gate 116 of bit cell 110 and through the channel region between select gate 125 and control gate 126 of bit cell 120. When they reach the portions of the channel regions under control gates 116 and 126 of bit cells 110 and 120, respectively, the charge carriers are attracted by the high voltage at control gates 116 and 126. In a hot carrier injection process, the charge carriers are injected into charge trapping sites in the dielectric stack under control gates 116 and 126. As the negative charge carriers, e.g., electrons, are injected into the charge trapping sites under control gates 116 and 126, the threshold voltages of the portions of the channel regions under control gates 116 and 126 increase. Thus, the currents flowing through bit cells 110 and 120 decrease and so do the rates of hot carrier injection. After the programming voltages are removed from NVM device 50, the injected carriers remain in the charge trapping sites under control gates 116 and 126. A first logic value, e.g., a logic one, is stored in bit cells 110 and 120, i.e., bit cells 110 and 120 are programmed.

To electrically erase the bit cells, e.g., the bit cells in the first and second rows, of NVM device 50, a source erasing voltage is applied to source line 52, and a control erasing voltage is applied to control lines 71 and 72. By way of example, a positive voltage ranging from approximately five volts to approximately seven volts is selected as the source erasing voltage, and a negative voltage ranging from −11 volts to approximately −9 volts is selected as the control erasing voltage. Source line 54, select lines 63 and 64, and control lines 73 and 74 are coupled to ground voltage level. In one embodiment, select lines 61 and 62 and bit lines 81, 82, 83, and 84 are coupled to ground voltage level. In an alternative embodiment, select lines 61 and 62 and bit lines 81, 82, 83, and 84 floating. In another alternative embodiment, a select erasing voltage, e.g., a voltage between approximately −3 volts and approximately −0.5 volt, is applied select lines 61 and 62, and a bit erasing voltage, e.g., ground voltage, is applied to bit lines 81, 82, 83, and 84. Because the select gates of the bit cells in the first row and the second row are at a lower voltage level that their respective drains, the channel regions of the bit cells in the first row and the second rows are ensured to be switched off. In yet another alternative embodiment, a bit erasing voltage, e.g., a voltage between approximately two volts and approximately five volts, is applied bit lines 81, 82, 83, and 84 to avoid inadvertent charge carrier injections form the drains to the channel regions of the bit cells in the first row and the second row.

Because of a high voltage difference between the sources and the control gates of the bit cells in the first and second rows, e.g., ranging from approximately fourteen volts to approximately eighteen volts, strong electric fields are established under control gates near the sources of the bit cells in the first and second rows. Through band to band tunneling, the strong electric fields generate electron-hole pairs in the portions of the channel regions under the control gates. The holes, which are positive charge carriers, are attracted by the negative voltage at the control gates. In a hot carrier injection process, the holes are injected into the charge trapping sites in the dielectric stacks under the respective control gates. The injected holes combine with the electrons in the charge trapping sites of the bit cells in the first and second rows. Preferably, the erasing process continues until the charge trapping sites of the bit cells in the first and second rows become substantially electrically neutral. The charge trapping sites may also become positively charged in an over-erasing process. After the erasing voltages are removed from NVM device 50, the charge trapping sites of the bit cells in the first and second rows remain substantially neutral or positively charged. In either case, a second logic value, e.g., a logic zero, is stored in bit cells 110, 120, 130, 140, 210, 220, 230, and 240, i.e., the bit cells in the first and second rows in NVM device 50 are erased.

To read data from bit cells, e.g., bit cells 430 and 440, of NVM device 50, a first select reading voltage is applied to the select line 64. By way of example, the first select reading voltage is the supply voltage $V_{DD}$. A control reading voltage between, for example, approximately one volt and approximately two volts is applied to control line 74. Because the bit cells in the first, second, and third rows do not participate in the process of reading data from bit cells 430 and 440, they are preferably switched off by applying a second select reading voltage, e.g., ground voltage, to select lines 61, 62, 63, and 64. A source reading voltage, e.g., ground voltage, is applied to source lines 52 and 54. A first bit reading voltage between approximately one volt and approximately two volts is applied to bit lines 83 and 84. A second bit reading voltage, e.g., ground voltage, is applied to bit lines 81 and 82. Preferably, the second bit reading voltage applied to bit lines 81 and 82 is substantially equal to the source reading voltage applied to source lines 52 and 54. Thus, the currents flowing in bit cells 410 and 420 are substantially zero during the process of reading data from bit cells 430 and 440. The control reading voltage applied to control line 74 is preferably at least as high as source reading voltage applied to source line 54. The first select reading voltage applied to select line 64 is preferably higher than the source reading voltage applied to source line 54 by at least the threshold voltages of the portions of the channel regions under select gates 435 and 445 of bit cells 430 and 440, respectively. The second select reading voltage applied to select lines 61, 62, and 63 is preferably lower than the sum of a threshold voltage of a portion of a channel region under a select gate of a bit cell in the first, second, or third row and the source reading voltage applied to source lines 52 and 54.

If bit cell 430 has been programmed, the charge trapping sites under control gate 436 are negatively charged. The portion of the channel region under control gate 436 has a threshold voltage that is higher than its intrinsic threshold voltage when the charge trapping sites are substantially neutral. If bit cell 430 has been erased, the charge trapping sites under control gate 436 are substantially neutral or positively charged. The portion of the channel region under control gate 436 has a threshold voltage that is substantially equal to or lower than its intrinsic threshold voltage. Preferably, the control reading voltage applied to control line 74 is lower than the threshold voltage of the portion of the channel region under control gate 436 if bit cell 430 has been programmed and higher than the threshold voltage of the portion of the channel region under control gate 436 if bit cell 430 has been erased. Therefore, when reading data from a programmed bit cell 430, the channel region of bit cell 430 is nonconductive and the current flowing therethrough is small, e.g., equal to or less than approximately 2 $\mu$A. A sense amplifier (not shown) coupled to bit line 83 senses the small current and reads the first logic value, e.g., logic one, from bit cell 430. On the other hand, when reading data from an erased bit cell 430, the channel region of bit cell 430 is conductive and the current flowing therethrough is large, e.g., equal to or greater than approximately 10 $\mu$A. The sense amplifier (not shown) coupled to bit line 83 senses the large current and reads the second logic value, logic zero, from bit cell 430.

If bit cell 440 has been programmed, the charge trapping sites under control gate 446 are negatively charged. The portion of the channel region under control gate 446 has a threshold voltage that is higher than its intrinsic threshold voltage when the charge trapping sites are substantially neutral. If bit cell 440 has been erased, the charge trapping sites under control gate 446 are substantially neutral or positively charged. The portion of the channel region under control gate 446 has a threshold voltage that is substantially equal to or lower than its intrinsic threshold voltage. Preferably, the control reading voltage applied to control line 74 is lower than the threshold voltage of the portion of the channel region under control gate 446 if bit cell 440 has been programmed and higher than the threshold voltage of the portion of the channel region under control gate 446 if bit cell 440 has been erased. Therefore, when reading data from a programmed bit cell 440, the channel region of bit cell 440 is nonconductive and the current flowing therethrough is small, e.g., equal to or less than approximately 2 $\mu$A. A sense amplifier (not shown) coupled to bit line 84 senses the small current and reads the first logic value, e.g., logic one, from bit cell 440. On the other hand, when reading data from an erased bit cell 440, the channel region of bit cell 440 is conductive and the current flowing therethrough is large, e.g., equal to or greater than approximately 10 $\mu$A. The sense amplifier (not shown) coupled to bit line 84 senses the large current and reads the second logic value, logic zero, from bit cell 440.

During the process of reading data from bit cells 430 and 440, sources 432 and 442 are at a lower voltage level than drains 434 and 444, respectively. The voltage drops across the portions of the channel regions under control gates 436 and 446 are small. Thus, the probability of charge carriers being inadvertently injected from the channel regions into the charge trapping sites is small. In addition, the channel regions which separate the drains from the charge trapping sites in the bit cells in the first, second, and third rows are switched off by the second select reading voltage applied to select lines 61, 62, and 63. Thus, the disturbance of the reading process of the bit cells in the first, second, and third rows is small. Therefore, the reading process of the present invention has a smaller read disturb than prior art reading processes. Further, because the bit lines in NVM device 50 are separated from the charge trapping sites in the bit cells by the select gates in the corresponding bit cells, the capacitance values of the parasitic bit line capacitors are substantially independent of the charge in the charge trapping sites. In other words, the data dependence of the parasitic bit line capacitance is small in NVM device 50. An NVM device, such as NVM device 50, having a small data dependence of the bit line capacitance is suitable for high performance applications.

By now it should be appreciated that an NVM device and a method for accessing the NVM device have been provided. The NVM device includes an array of split-gate FETs, each FET having a control gate overlying a first portion of the channel region near the source and a select gate overlying a second portion of the channel region near the drain. The control gate can be formed as a sidewall spacer adjacent the select gate, thereby increasing the silicon area efficiency of the NVM device.

When programming a FET in the NVM device, charge carriers of a first polarity, e.g., electrons, are accelerated in the portion of the channel region between the select gate and the control gate before being injected into charge trapping sites located in a dielectric stack underlying the control gate. The select gate control the current flowing in the channel region during the programming process. The programming process can be optimized for time efficiency and power efficiency.

A FET in the NVM device is erased by injecting charge carriers of a second polarity e.g., holes, from the channel region into the charge trapping sites. Because the charge carriers do not travel through a top dielectric layer in the dielectric stack during the erasing process, a thick top dielectric layer can be used to increase the data retention rate of the NVM device.

When reading data from a FET in the NVM device, a reading voltage is applied to the drain adjacent the select gate. Therefore, the read disturb of the data and the breakdown of the FET are minimized, which further increase the data retention and reliability of the NVM device. In addition, the data is read from the FET by sensing a current flowing in a bit line coupled to the drain of the FET, which is separated from the charge trapping sites by a portion of the channel region under the select gate. Thus, the data dependence of the bit line capacitance is minimized and the NVM device is suitable for high performance applications.

We claim:

1. A split-gate memory device, comprising:
   a body of semiconductor material having a major surface;
   a source region in the body of semiconductor material;
   a drain region in the body of semiconductor material;
   a channel region in the body of semiconductor material separating the source region from the drain region;
   a dielectric layer on the major surface overlying a first portion of the channel region adjacent the drain region;
   a dielectric stack on the major surface overlying a second portion of the channel region adjacent the source region;

a first conductive layer over the dielectric layer, the first conductive layer having a first sidewall adjacent the drain region and a second sidewall opposite to the first sidewall;

a second conductive layer over the dielectric stack, the second conductive layer having a first sidewall adjacent the source region and a second sidewall opposite to the first sidewall;

an insulating layer over the major surface between the second sidewall of the first conductive layer and the second sidewall of the second conductive layer; and a dielectric spacer over the second conductive layer and over a portion of the major surface adjacent the first sidewall of the second conductive layer, wherein the source region is substantially aligned with the dielectric spacer, and the drain region is substantially aligned with the first sidewall of the first conductive layer.

2. The split-gate memory device of claim 1, wherein the dielectric stack includes:

a bottom dielectric layer on the major surface;

a nitride layer on the bottom dielectric layer; and a top dielectric layer on the nitride layer, the top dielectric layer having a thickness between approximately 5 nanometers (nm) and approximately 15 nm.

3. The split-gate memory device of claim 1, wherein the first conductive layer and the second conductive layer are polycrystalline silicon layers.

4. The split-gate memory device of claim 1, wherein the second conductive layer is a sidewall spacer adjacent the second sidewall of the first conductive layer.

5. The split-gate memory device of claim 1, further comprising a silicide structure overlying the first conductive layer.

6. A split-gate memory device, comprising:

an array of memory cells arranged in a plurality of columns and a plurality of rows on a semiconductor substrate having a major surface, each memory cell in the array including:

a source region, a channel region, and a drain region in the semiconductor substrate, the channel region separating the source region from the drain region;

a first dielectric layer over the major surface of the semiconductor substrate overlying a first portion of the channel region adjacent the drain region;

a second dielectric layer over the major surface of the semiconductor substrate overlying a second portion of the channel region adjacent the source region;

a control gate over the second dielectric layer;

a select gate over the first dielectric layer; and an insulating layer between the control gate and the select gate;

a first bit line coupled to the drain region of each memory cell in a first column of the plurality of columns in the array;

a second bit line coupled to the drain region of each memory cell in a second column of the plurality of columns in the array;

a first select line coupled to the select gate of each memory cell in a first row of the plurality of rows in the array;

a second select line coupled to the select gate of each memory cell in a second row of the plurality of rows in the array;

a first control line coupled to the control gate of each memory cell in the first row;

a second control line coupled to the control gate of each memory cell in the second row; and a first source line coupled to the source region of each memory cell in the first row and the second row.

7. The split-gate memory device of claim 6, wherein the second dielectric layer includes:

a first silicon dioxide layer on the major surface having a thickness between approximately 5 nanometers (nm) and approximately 15 nm;

a silicon nitride layer on the first silicon dioxide layer having a thickness between approximately 5 nm and approximately 15 nm; and a second silicon dioxide layer on the silicon nitride layer having a thickness between approximately 5 nm and approximately 15 nm.

8. The split-gate memory device of claim 6, wherein:

the select gate is a polycrystalline silicon gate; and the control gate is a polycrystalline silicon sidewall spacer adjacent the select gate.

9. The split-gate memory device of claim 6, each memory cell in the array of memory cells further including:

a dielectric spacer over the control gate and over a portion of the major surface adjacent the control gate, wherein the source region is substantially aligned with the dielectric spacer; and a silicide structure overlying the select gate.

10. The split-gate memory device of claim 6, further comprising:

a third select line coupled to the select gate of each memory cell in a third row of the plurality of rows in the array;

a fourth select line coupled to the select gate of each memory cell in a fourth row of the plurality of rows in the array;

a third control line coupled to the control gate of each memory cell in the third row;

a fourth control line coupled to the control gate of each memory cell in the fourth row; and a second source line coupled to the source region of each memory cell in the third row and the fourth row.

11. The split-gate memory device of claim 10, wherein the first control line is coupled to the second control line and wherein the third control line is coupled to the fourth control line.

12. The split-gate memory device of claim 10, wherein the first source line is coupled to the second source line.

* * * * *